(12) United States Patent
Ohkubo

(10) Patent No.: US 6,538,682 B2
(45) Date of Patent: Mar. 25, 2003

(54) EXPOSURE DEVICE

(75) Inventor: Kazunobu Ohkubo, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/029,177

(22) Filed: Dec. 28, 2001

(65) Prior Publication Data

US 2002/0085187 A1 Jul. 4, 2002

(30) Foreign Application Priority Data

Dec. 28, 2000 (JP) .................................. 2000-402578

(51) Int. Cl.[7] ................................................ B41J 27/45
(52) U.S. Cl. .................... 347/241; 347/238; 347/244
(58) Field of Search ............................ 347/238, 241, 347/242, 244; 355/18, 41

(56) References Cited

U.S. PATENT DOCUMENTS

| 4,096,486 | A | * | 6/1978 | Pfeifer et al. ................ 347/238 |
| 5,477,259 | A | * | 12/1995 | Iwasa ........................ 347/238 |
| 6,188,466 | B1 | * | 2/2001 | Iwasa et al. .................... 355/70 |
| 6,480,220 | B1 | * | 11/2002 | Tamaki ........................ 347/242 |
| 2002/0118270 | A1 | * | 8/2002 | Gaudiana et al. ........... 347/238 |
| 2002/0118271 | A1 | * | 8/2002 | Mashimo et al. ........... 347/241 |
| 2002/0135664 | A1 | * | 9/2002 | Mashimo et al. ........... 347/238 |

FOREIGN PATENT DOCUMENTS

| JP | 7-22649 | 1/1995 |
| JP | 10-172756 | 6/1998 |
| JP | 11-354271 | 12/1999 |

* cited by examiner

*Primary Examiner*—Alan A. Mathews
(74) *Attorney, Agent, or Firm*—Sughrue Mion, PLLC

(57) ABSTRACT

The present invention provides an exposure device in which availability of the emitted light is high, optical crosstalk is reduced, and an image can be formed at high resolution. Concave microlenses are formed on one surface of the exposure device facing a photosensitive material, and organic EL elements are formed on the other surface. The organic EL elements are disposed at some of portions at which anode lines and cathode lines intersect each other. A diameter D of an aperture of the microlens is n times an array pitch p of each organic EL element, n lines of the cathode lines are formed, and the organic EL elements arranged on one cathode line are shifted from those on another cathode line in a main-scanning direction by the array pitch p. Accordingly, exposure spots, which are exposed by the organic EL elements incorporated in the n lines of the cathode lines, are offset without overlapping one another, and the entire photosensitive material can be exposed.

18 Claims, 11 Drawing Sheets

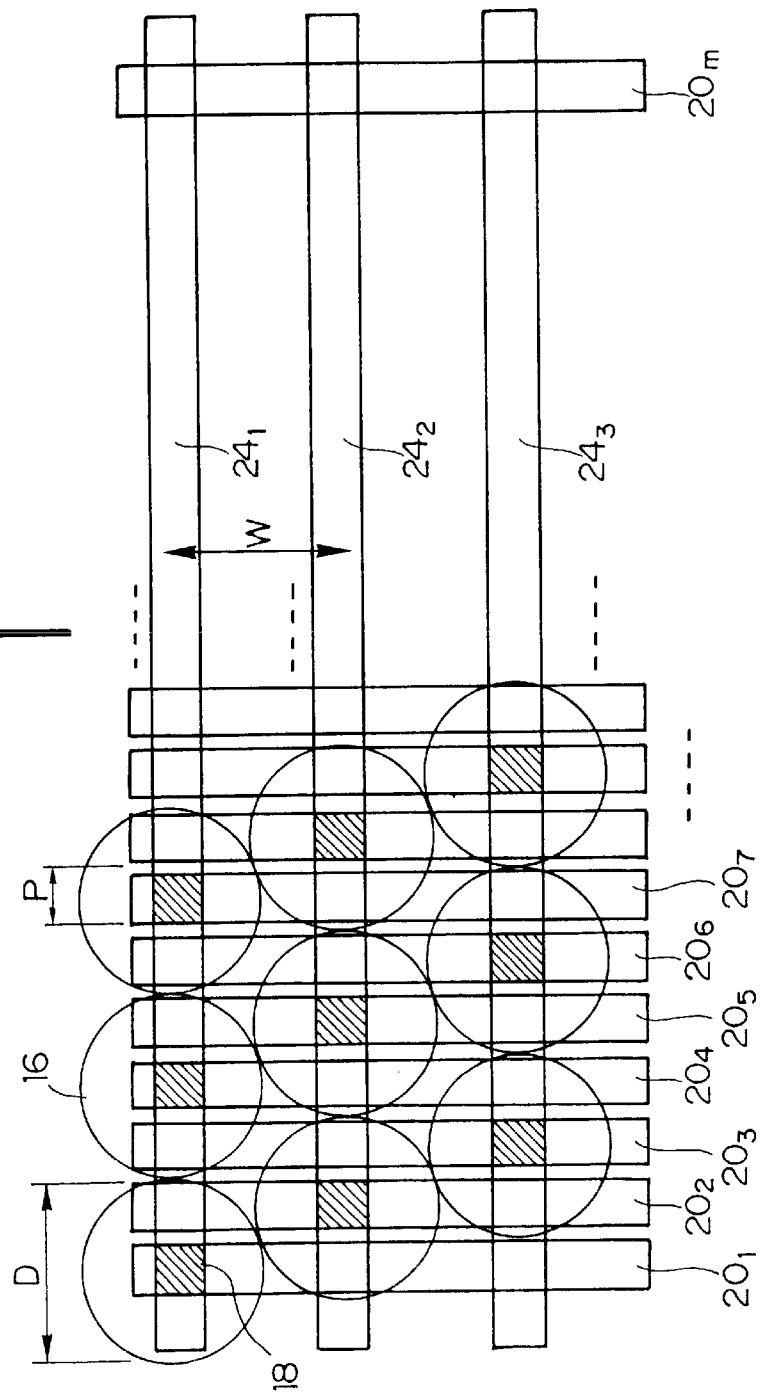

MAIN-SCANNING
DIRECTION

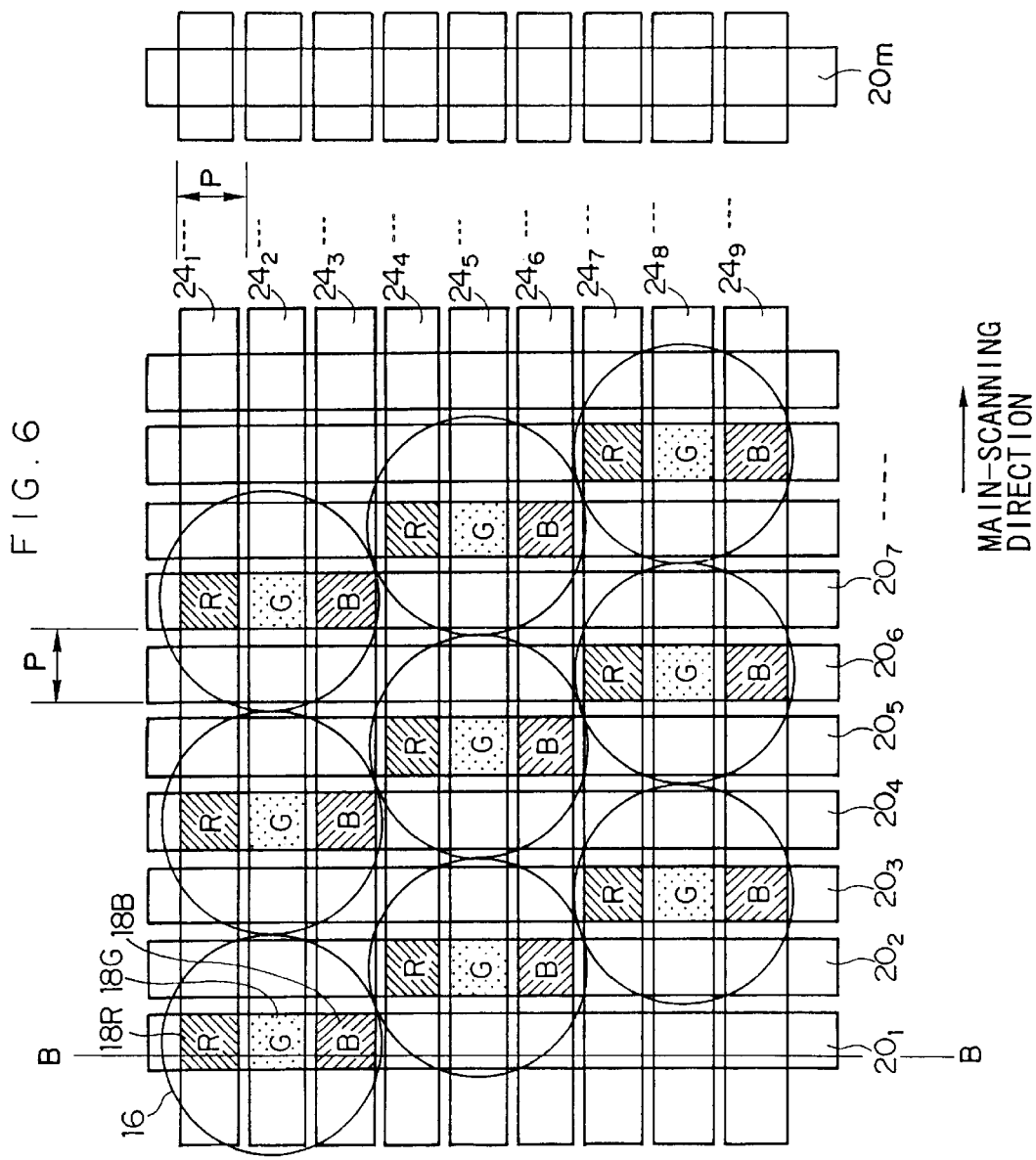

EXPOSURE DEVICE

BACKGROUND OF THE INVENTION

1. Field of the Invention

The present invention relates to an exposure device, and more particularly, to an exposure device using electroluminescence (EL) elements as a light source.

2. Description of the Related Art

An organic electric field light emitting element that employs a fluorescent organic substance as a material for a light emitting layer is referred to as an 'organic EL element'. Since the organic EL element has such advantages that manufacturing thereof is more facilitated than other light emitting elements and a thin and light weight light emitting element can be formed, the organic EL element has conventionally been studied and developed as a thin type display element. In recent years, a high performance organic EL element, which is comparable with a light emitting diode (LED) in terms of light emitting luminance, light emitting efficiently, durability, and the like, has been developed. Therefore, application has been studied of an organic EL element to an exposure head for exposing a photosensitive material such as a silver halide photosensitive material. For example, Japanese Patent Application Laid-Open (JP-A) No. 7-22649 discloses a light exposing device having an optical recording unit using the organic EL element.

Typically, an organic EL element is structured such that an organic compound layer having a light emitting layer is provided on a transparent substrate, and a pair of electrode layers (including a cathode layer and an anode layer) for interposing the organic compound layer therebetween is layered. The emitted light is outputted from the transparent substrate side. However, since the emitted light is a diffusing light source and reflected from the transparent substrate, light outputting efficiency becomes low, and a sufficient exposure amount can be obtained.

Conversely, Japanese Patent Application Laid-Open (JP-A) No. 10-172756 discloses an organic EL light emitting device in which a microlens is placed on the organic EL element between a light emitting layer, and a light outputting surface of the transparent substrate so as to correspond to each other 1 to 1 to thereby improve the light outputting efficiency and increase light emitting luminance in the direction of optical axis. Further, Japanese Patent Application Laid-Open (JP-A) No. 11-354271 discloses a photosensitive material recording device in which an organic EL element array is formed on a substrate having a microlens, whereby availability of the emitted light amount has improved.

However, when the aperture area of the microlens has the same dimension as that of a light emitting portion of the organic EL element, a problem is caused in that the light emitted from the light emitting portion cannot be converged sufficiently, whereby the exposure amount of the light becomes insufficient. Further, a problem has also arisen in that, since the organic EL element is a diffusing light source, crosstalk may occur when the area of the microlens aperture and that of the light emitting portion of the organic EL element are the same. Accordingly, the aforementioned problem can be solved by making the area of the microlens aperture larger than that of the light emitting portion of the organic EL element. However, when the area of the microlens aperture is made larger, there is a problem in that a distance between organic EL elements becomes larger, i.e. a pixel pitch increases, and unexposed portions are formed on an object to be exposed, thus making the organic EL elements impossible to function sufficiently as an exposure device.

SUMMARY OF THE INVENTION

In view of the aforementioned facts, an object of the present invention is to provide an exposure device capable of obtaining high availability of the emitted light, reducing optical crosstalk, and forming an image at high resolution.

In order to accomplish the aforementioned objects, a first exposure device is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, and the electric field light emitting elements each including a light emitting portion; and microlenses, each one of which is formed on the transparent substrate so as to correspond to one of the electric field light emitting elements and focuses light emitted from the light emitting portion of the one electric field light emitting element for exposing an object to be exposed, wherein the one microlens has an aperture which is larger than an array pitch of the one corresponding electric field light emitting element, and the electric field light emitting elements are arranged such that a portion corresponding to a gap between portions exposed by the light emitting portions of one of the rows can be exposed by one of the light emitting portions of an adjacent one of the rows.

The first exposures device is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, and the electric field light emitting elements each including a light emitting portion; and microlenses, each one of which is formed on the transparent substrate so as to correspond to one of the electric field light emitting elements and focuses light emitted from the light emitting portion of the one electric field light emitting element for exposing an object to be exposed.

In this exposure device, the aperture of the microlens is made larger than the array pitch of the electric field light emitting element corresponding to the microlens, whereby high availability of the emitted light can be obtained, and optical crosstalk can be inhibited. Further, the electric field light emitting elements are arranged so that a portion corresponding to a gap of the exposed portion exposed by the light emitting portion in one of the neighboring rows of the electric field light emitting elements can be exposed by the exposed portion of the light emitting portion in the other, whereby, even when a distance between respective electric field light emitting elements located on the exposure device becomes larger, a portion which is exposed by the light emitting portion (unexposed portion) of one of the neighboring rows can be exposed by the light emitting portion of the other, and the unexposed portions are not formed on the object to be exposed. Accordingly, an image can be exposed at high resolution.

In the first exposure device, image resolution in the main-scanning direction can be controlled by an array pitch of the electric light emitting element in the main-scanning direction, while image resolution in the sub-scanning direction can be controlled by an amount in which the exposure device and the object to be exposed relatively move in the sub-scanning direction (sub-scanning control amount). Therefore, the light emitting portions of the electric field light emitting elements are formed so as to have a predetermined dimension either in the main-scanning direction or the sub-scanning direction. And n rows of elements (n is an integer of 2 or more) are disposed in the sub-scanning direction, and the plurality of the electric field light emitting elements are arranged so that a main-scanning direction array pitch p between the light emitting portion of one of the neighboring rows of elements and the light emitting portion of the other satisfies a relationship of p=px/n, wherein px represents an array pitch of each of the rows of the electric field light emitting elements, whereby the configuration of the light emitting portion of the electric field light emitting element is not specifically limited, so it can be formed in an arbitrary shape such as circular, ellipse, or rectangular.

When a circular microlens is used, if the microlens is formed so that an aperture diameter D of the microlens satisfies a relationship of $D \leq px$, and $D \leq (py^2+p^2)^{1/2}$, wherein py represents an array pitch of each row of elements in the sub-scanning direction, the center of the light emitting element and the center of the microlens are aligned, whereby each microlens can be disposed so as to correspond to each electric field light emitting element without overlapping one another.

Moreover, in the first exposure device, the aperture diameter D of a microlens is n times (n is an integer of 2 or more) of the array pitch p of the electric field light emitting element corresponding to the microlens, n rows of elements are disposed in the sub-scanning direction, and the electric field light emitting elements can be arranged so that a light emitting portion in one of the neighboring rows of elements and a light emitting portion in the other are shifted from each other in the main-scanning direction by the array pitch p.

In the exposure device in this state, the aperture diameter D of the microlens is n times the array pitch p of the corresponding electric field light emitting element, n rows of elements are disposed in the sub-scanning direction, and the electric field light emitting elements are arranged so that the light emitting portion in one of the neighboring rows of elements and the light emitting portion in the other are shifted from each other in the main-scanning direction by the array pitch p. In order to arrange a microlens having an aperture diameter D that is n times the array pitch p of the electric field light emitting element corresponding thereto, a distance that is (n−1) times the array pitch p of the corresponding electric field light emitting element becomes necessary in the main-scanning direction and the sub-scanning direction, respectively. However, as described above, in this exposure device, the electric field light emitting elements are arranged so that a light emitting portion in one of the neighboring rows of elements and a light emitting portion in the other are shifted from each other by an array pitch p in the main-scanning direction, and n rows of elements are disposed in the sub-scanning direction. Accordingly, the object to be exposed can be exposed by the n rows of the elements without forming a gap between the rows, whereby unexposed portions are prevented from being formed on the object to be exposed, and image can be exposed onto the object to be exposed at high resolution.

A second exposure device of the present invention is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, the electric field light emitting elements each including a light emitting portion, and the electric field light emitting elements being arranged so as to form a plurality of sets, each set including electric field light emitting elements that have mutually different light emitting wavelengths arranged in one of the main-scanning direction and the sub-scanning direction; and microlenses each one of which is formed on the transparent substrate so as to correspond to one of the sets of electric field light emitting elements, and focuses light emitted from the light emitting portions of the one set for exposing an object to be exposed, wherein the one microlens has an aperture which is larger than an array pitch of each of the electric field light emitting elements forming the one set of electric field light emitting elements, and the electric field light emitting elements are arranged so that a portion corresponding to a gap between portions exposed by light emitting portions of one light emitting wavelength in one of the rows can be exposed by one of light emitting portions, of the one light emitting wavelength in an adjacent one of the rows.

The second exposure device is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, the electric field light emitting elements each including a light emitting portion, and the electric field light emitting elements being arranged so as to form a plurality of sets, each set including electric field light emitting elements that have mutually different light emitting wavelengths arranged in one of the main-scanning direction and the sub-scanning direction; and microlenses each one of which is formed on the transparent substrate so as to correspond to one of the sets of electric field light emitting elements, and focuses light emitted from the light emitting portions of the one set for exposing an object to be exposed.

In this exposure device, the electric field light emitting elements having different light emitting wavelengths are arranged so as to form a plurality of sets of the electric field light emitting elements which are arranged both in the main-scanning direction and the sub-scanning direction, whereby one microlens can be allocated to each of the electric field light emitting elements for forming a set thereof. The microlens aperture is made larger than the array pitch of each of the electric field light emitting elements for forming a set of the electric field light emitting elements corresponding thereto, whereby availability of the emitted light amount increases, and optical crosstalk can be reduced. Further, the electric field light emitting elements are arranged so that a portion corresponding to a gap of each portion exposed by the light emitting portions of the same light emitting wavelength in one of the neighboring rows containing the electric field light emitting elements of the same light emitting wavelength can be exposed by the light emitting portions of the same light emitting wavelength in the other. Accordingly, even when a distance between the electric field light emitting elements becomes larger in accordance with the microlens aperture, an unexposed portion by the light emitting portions in one of the neighboring rows can be exposed by the light emitting portion in the other, whereby it becomes possible to prevent unexposed portions from being formed on the object to be exposed, and image can be exposed onto the object to be exposed at high resolution.

Moreover, in the exposure device described above, the microlens used a convex lens formed at the light emitting side of the transparent substrate, a distribution refracting lens inside the transparent substrate, and a combination lens of the convex lens and the distribution refracting lens can be used.

In this exposure device, it is preferable that an organic electric field light emitting element is used as an electric field light emitting element.

If a gap is formed between the neighboring microlenses, a portion of the light of the emitted light that has been forwarded to the gap is not only unavailable for the exposure but also is converted to stray light, thus leading to the deterioration of image quality. For this reason, in the aforementioned exposure device, it is preferable that the neighboring microlenses are formed by being kept in close contact with each other. Further, it is more preferable that the aperture of one of the neighboring microlenses and that of the other are partially overlapped. For example, when a microlens aperture corresponding to one light emitting element is formed so as to correspond each of sides or borders of the microlens to a vertical bisector of the line connecting the light emitting element and the light emitting element neighboring thereto, the connecting portion can be linearly kept in close contact with each other. Thus, the neighboring microlenses are kept in close contact with one another, whereby almost the entire amount of the emitted light from the electric field light emitting elements can be used for the exposure, and availability of the emitted light can be substantially maximal.

BRIEF DESCRIPTION OF THE DRAWINGS

FIG. 3 is a schematic plan view of a layout of microlenses, organic EL elements, and electrodes of an exposure head according to the first embodiment of the present invention;

FIG. 6 is a plan view illustrating a layout of microlenses, organic EL elements, and electrodes of an exposure head according to a third embodiment of the present invention;

DETAILED DESCRIPTION OF THE PREFERRED EMBODIMENT

With reference to the drawings, a detailed description of embodiments of the present invention will be given hereinafter.

(First Embodiment)

Figure 1:
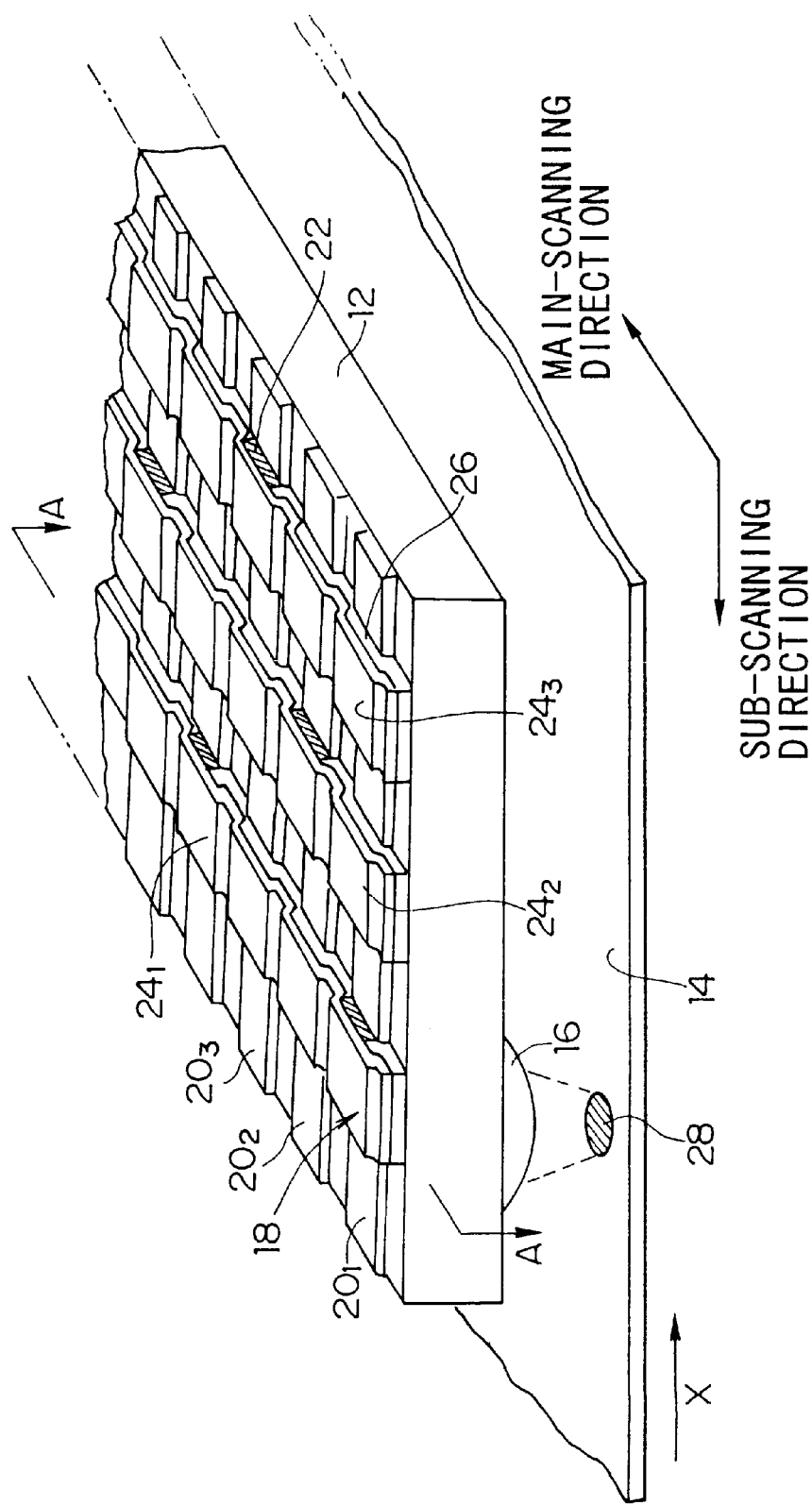
FIG. 1 is a schematic perspective view of an exposure head according to a first embodiment of the present invention.

As shown in FIG. 1, an exposure head of an exposure device according to a first embodiment of the present invention comprises a transparent substrate 12 whose lengthwise direction is a main scanning direction. A micorlens array comprising multiple convex micorlenses 16 is formed on one surface of the transparent substrate 12 facing a photosensitive material 14 which is an object to be exposed, and an organic EL element array comprising organic EL elements 18 is formed on the other surface of the transparent substrate 12.

The transparent substrate 12 can use a plastic substrate other than a general glass substrate. The plastic substrate needs a material which is excellent in heat resistance, size stability, solvent resistance, electrically insulating property, workability, low permeability, and hygroscopicity. Examples of such a material include: polyethylene telephthalate, polybutylene telephthalate, polyethylene naphthalate, polystyrene, polycarbonate, polyethersulphone, polyacrylate, allyldiglycolecarbonate, polyimide, and the like.

Figure 2:
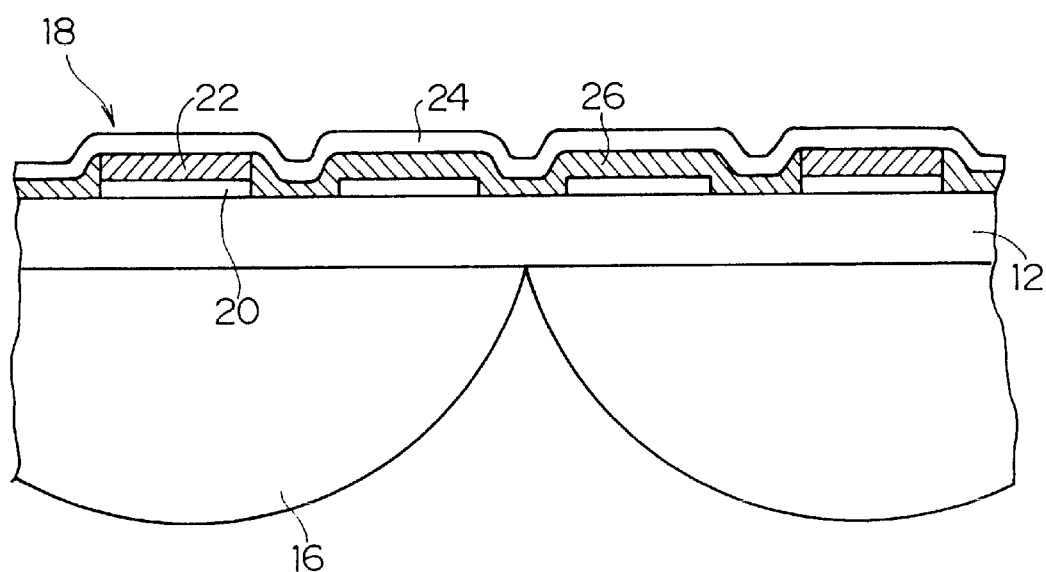
FIG. 2 is a cross-sectional view taken along a line A—A of the exposure head according to the first embodiment of the present invention.

As shown in FIG. 2, each organic EL element 18 for constituting the organic EL element array is structured such that transparent electrodes 20 serving as anodes, an organic compound layer 22 including a light emitting layer, and metallic electrodes 24 serving as cathodes are sequentially disposed on the transparent substrate 12 serving as a common substrate.

It is preferable that the transparent electrodes 20 has a light transmissivity which is 50% or more, and preferably 70% or more within a wavelength region of 400 to 700 nm of a visible light. Other than compounds which are known as transparent electrode materials such as stannic oxide, indium stannic oxide (ITO), and indium zinc oxide, a metallic thin film such as gold or platinum having a large work function can be used for forming the transparent electrodes 20. Alternatively, organic compounds such as polyaniline, polythiophene, polypyrrol, or the derivatives thereof can be used.

The organic compound layer 22 can be a single layer structure which is merely formed by the light emitting layer. Alternatively, other than the light emitting layer, it can be a layer structure appropriately having a hole injection layer, a hole conveying layer, an electron injection layer, an electron conveying layer, or the like. Examples of specific structures (represented by including electrodes) of the organic compound layer 22 include: an anode/a hole injection layer/a hole conveying layer/a light emitting layer/an electron conveying layer/a cathode, an anode/a light emitting layer/an electron conveying layer/a cathode, an anode/a hole conveying layer/a light emitting layer/an electron conveying layer/a cathode, and the like. A plurality of the light emitting layers, the hole conveying layers, and the hole injection layers can be disposed.

For example, the metal electrodes 24 are preferably formed by metallic materials having low work functions: including alkali metals such as Li, and K, alkali earth materials such as Mg and Ca, and an alloy or a mixture of these metals and Ag or Al. Electrodes produced by the aforementioned materials can be further coated with Ag, Al, or Au with high work function and high electric conductivity in order to coexist storage stability and electron injection performance.

The organic EL element 18 having the above-described layer structure can be formed by using, as necessary, such a conventional method as disclosed in "Strategic development of organic EL elements" (edited by display device research workshop for the next generation of Science Forum Inc., Jun. 30, 1992) or "Search for the arrival points and practical strategies of organic Els" (papers from organic electronics material workshop held at Hotel Tenbo in Ikaho Onsen in Gunma Pref., on Jul. 6–8, 1995).

The transparent electrodes (anodes) 20 are used as common electrodes for the organic EL elements 18 arranged in a sub-scanning direction, and anode lines $20_1$ to $20_m$ are formed on the transparent substrate 12 in accordance with a layout of the organic EL element array. The metal electrodes (cathodes) 24 are used as common electrodes for the organic EL elements 18 arranged in a main-scanning direction, and cathode lines $24_1$ to $24_3$ (three, for example, in FIG. 1) are formed on the transparent substrate 12 in accordance with the layout of the organic EL element array.

When a voltage is applied between the anode lines $20_1$ to $20_m$ and the cathode lines $24_1$ to $24_3$, light is emitted from the light emitting layer included in the organic compound layer 22 which was layered on portions at which the anode lines $20_1$ to $20_m$ and the cathode lines $24_1$ to $24_3$ intersect, and the emitted light is outputted from the transparent substrate 12 side. Namely, rows of the organic EL elements 18, which are arranged in the main-scanning direction separated from each other at a predetermined distance (gap), are also arranged in the sub-scanning direction.

Each of the organic EL elements 18 is provided at a portion of the entire intersecting portions of the anode lines $20_1$ to $20_m$ and the cathode lines $24_1$ to $24_3$. The intersecting portion not having therein the organic EL element 18 is provided with an insulating layer 26 in place of the organic compound layer 22. The transparent electrode 20 and the metal electrode 24 are insulated from each other by this insulating layer 26. Further, The transparent electrode 20 and the metal electrode 24 can be insulated from each other by the insulating layer 26 at the intersecting portion not including the organic EL elements 18. The insulating layer 26 can be disposed above or beneath the organic compound layer 22.

Each of the microlenses 16 for comprising a microlens array is formed so as to correspond to each organic EL element 18 by 1 to 1, and focuses light which is emitted from the organic EL element 18 on the photosensitive material 14 and forms an exposure spot 28. The aperture of the microlens 16 is made larger than the light emitting portion of one organic EL element 18 in order to decrease the exposure spot size and inhibit optical crosstalk. Ordinarily, the light emitting portion of the organic EL element 18 has a cross section which is substantially the same as that of the organic EL element 18 in a direction orthogonal to a direction in which the organic EL element 18 is layered.

An aperture diameter D of the micorlens 16 is determined by n times (n is an inter of 2 or more) of an array pitch p of each organic EL element. The 'diameter' of the light emitting portion can be a circle diameter when it is formed in a circular shape or a longitudinal length when it is formed in a rectangular shape. When the aperture diameter D is excessively larger than a thickness of the transparent substrate 12, light emitting characteristics of the organic EL element 18 are lost at the periphery of the lens, and the numerical aperture (NA) of the lens itself is limited, whereby focus performance deteriorates at the periphery of the lens. Therefore, it is preferable that D/t is no more than 2, wherein t represents the thickness of the transparent substrate. Namely, it is preferable that np/t is no more than 2, wherein D=np. For example, when thickness of the substrate t=0.6 mm, and when the organic EL element array pitch p=0.1 mm, n is preferably no more than 12.

With reference to a specific example, description of a relationship between an aperture diameter D of the microlens 16 and a pitch of the organic EL element 18 will be given next. FIG. 3 shows a schematic layout of the microlenses 16, the organic EL elements 18, the anode lines $20_1$ to $20_m$, and the cathode lines $24_1$ to $24_3$ of the present embodiment. In this example, the aperture diameter D of one microlens 16 is about three times the pitch p of one organic EL element 18, that is, substantially D=3p. In order to correspond one microlens 16 to one light emitting portion of one organic EL element 18, one of three anode lines 20 corresponds to one organic EL element 18 in the main-scanning direction at intersecting portions of m lines of the anode lines $20_1$ to $20_m$ and three lines of the cathode lines $24_1$ to $24_3$.

For example, regarding a first cathode line $24_1$, the organic EL elements 18 are disposed at intersecting portions of the anode line $20_1$ and the cathode line $24_1$, the anode line $20_4$ and the cathode line $24_1$, and the anode line $20_7$ and the cathode line $24_1$ on the first cathode line $24_1$, whereby a predetermined gap is formed between two organic EL elements 18 which are disposed adjacent to each other in the main-scanning direction. As will be described later, the predetermined gap is offset by the organic EL elements 18 formed on the remaining two cathode lines.

The organic EL elements 18 are disposed on the second cathode line $24_2$ at intersecting portions of the anode line $20_2$ and the cathode line $24_2$, the anode line $20_5$ and the anode line $24_2$, and the anode line $20_8$ and the anode line $24_2$. Namely, the organic EL elements 18 are formed on the second cathode line $24_2$ at positions which are shifted in the main-scanning direction, by an array pitch p of one organic EL element, from the positions of the organic EL elements 18 on the first cathode line $24_1$. Similarly, as for a third cathode line $24_3$, the organic EL elements 18 are formed on the third cathode line $24_3$ at positions which are shifted in the main-scanning direction, by the array pitch p of one organic EL element, from the positions of the organic EL elements 18 on the second cathode line $24_2$.

As can be seen from those examples, when the microlens aperture diameter D is determined by n times the pitch p of one organic EL element 18, n lines of the cathode lines are formed, the organic EL elements 18 are formed on each cathode line at positions which are shifted in the main-scanning direction, by the array pitch p of one organic EL element, from the positions of the organic EL elements 18, and exposure spots which are exposed by the organic EL elements incorporated in the n lines of the cathode lines do not superimpose, whereby the exposure spots can be offset with one another and the entire photosensitive material 14 can be exposed.

Resolution at which an image is formed is determined by appropriately choosing the aperture diameter D of the microlens 16, the array pitch p of the organic EL element 18, and the value of n. For example, if a pitch p of the organic EL element 18 is p=100 μm, and n=3, the aperture diameter D of the microlens 16 is D=300 μm, and image resolution of 254 dpi is thereby obtained. Further, if a pitch of the organic EL element p=85 μm, and n=3, the aperture diameter D=255 μm, and image resolution of 300 dpi is thereby obtained.

Figure 4A:
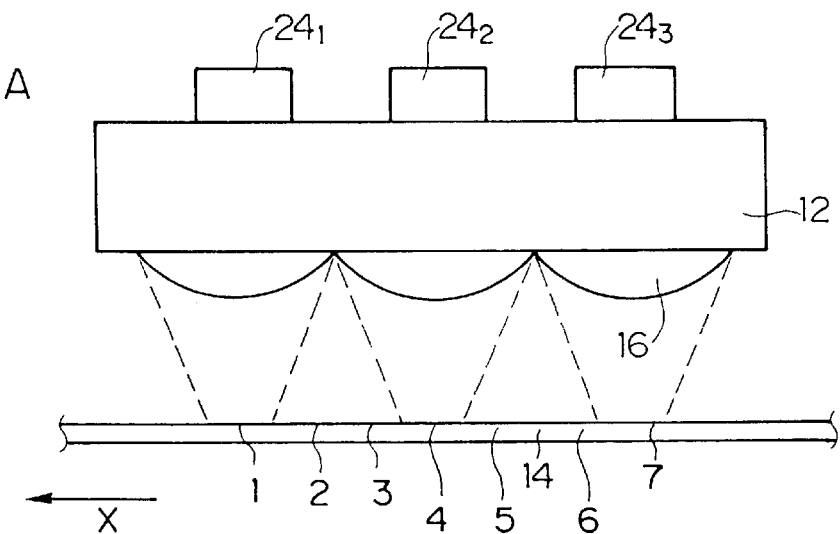
FIG. 4A is a schematic cross-sectional view for explaining the exposure operation of the exposure head according to the first embodiment of the present invention.
Figure 8C:
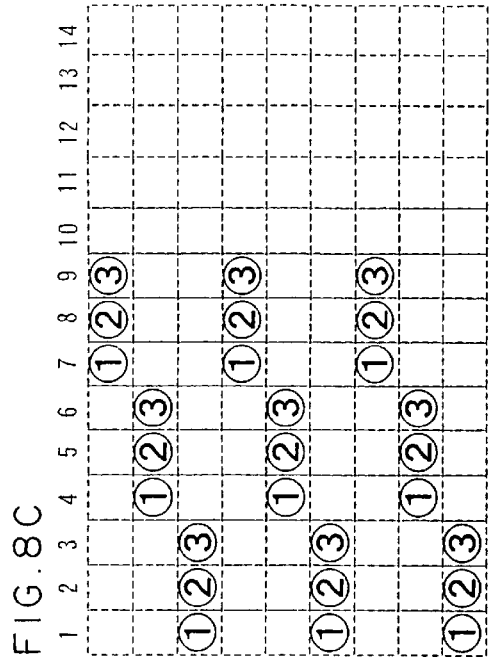
FIG. 8C is a view showing a portion to be exposed of the surface of the photosensitive material.
Figure 8D:
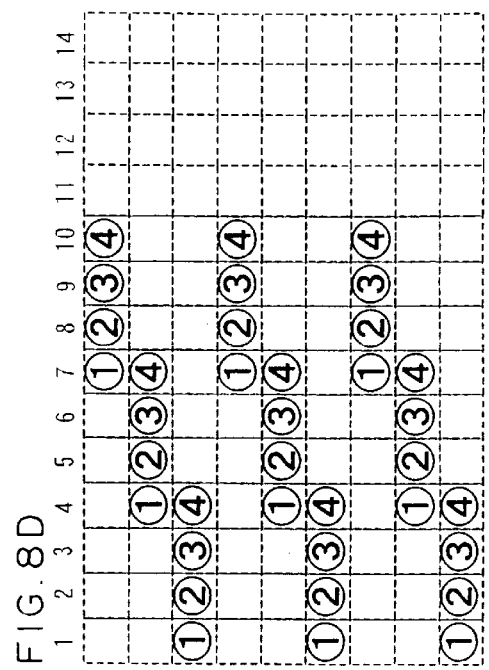
FIG. 8D is a view showing a portion to be exposed of the surface of the photosensitive material.
Figure 8A:
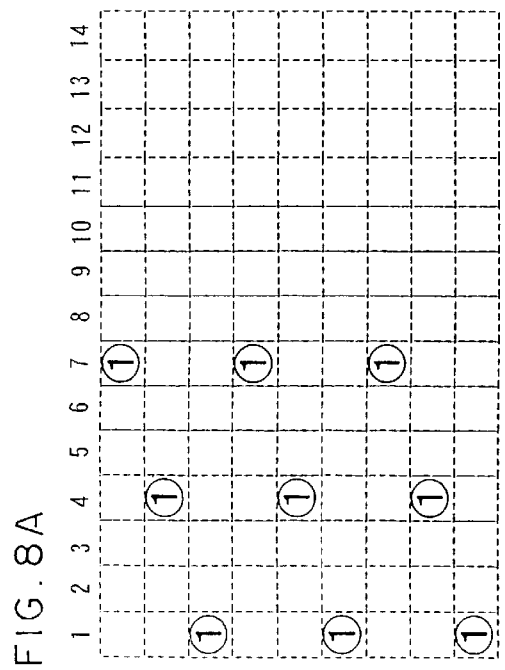
FIG. 8A is a view showing a portion to be exposed of the surface of a photosensitive material.

The lower limit of a pitch w of one cathode line is determined by the aperture diameter D of the neighboring microlenses 16 in the sub-scanning direction, and is represented by the following condition when D=np:

Description of an exposure operation of the exposure head will be given next. Unillustrated drivers are connected to this exposure head to directly modulate each of the organic EL elements 18 in accordance with image data. Further, image data for exposing one main-scanning line is converted to three, i.e. first to third image data so as to correspond to three cathode lines. As shown in FIG. 4A, the photosensitive material 14 is conveyed by an unillustrated conveying means at a predetermined speed in the direction of arrow X (inverse direction of the sub-scanning direction). Once a main-scanning start line 1 reaches an exposure position of an organic EL element on the first cathode line $24_1$, a main-scanning line 4 at the same time reaches an exposure position of an organic EL element on the second cathode line $24_2$, and a main-scanning line 7 at the same time reaches an exposure position of an organic EL element on the third cathode line $24_3$. Image data covering three main-scanning lines is transferred from the driver to each exposure head. Light is emitted from each of the organic EL elements of three cathode lines $24_1$ to $24_3$ in accordance with image data. The emitted light is focused on the surface of the photosensitive material 14 by the microlens 16 corresponding thereto to thereby expose portions of the photosensitive material 14 corresponding to the three lines at one time. Each portion to be exposed on each main-scanning line at this time is shown in FIG. 8A.

Figure 4B:
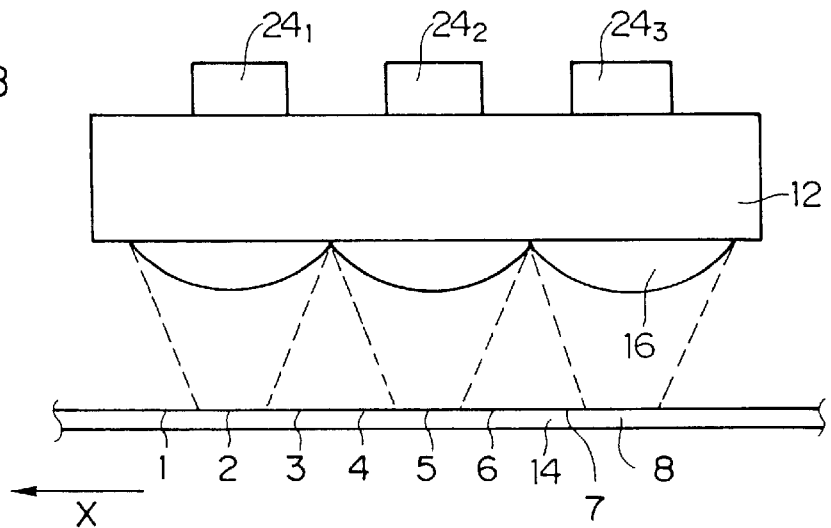
FIG. 4B is a schematic cross-sectional view for explaining the exposure operation of the exposure head according to the first embodiment of the present invention.
Figure 8B:
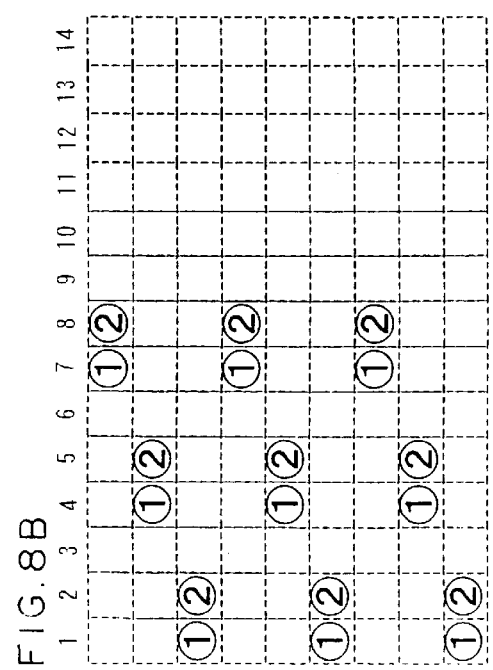
FIG. 8B is a view showing a portion to be exposed of the surface of the photosensitive material.

As shown in FIG. 4B, while the photosensitive material 14 is conveyed (sub-scanned), once a main-scanning line 2 reaches an exposure position of an organic EL element on the first cathode line $24_1$, a main-scanning line 5 at the same time reaches an exposure position of an organic EL element on the second cathode line $24_2$, and a main-scanning line 8 at the same time reaches an exposure position of an organic EL element on the third cathode line $24_3$. Image data covering three main-scanning lines is transferred from the driver to each exposure head. Light is emitted from each of the organic EL elements of the three cathode lines $24_1$ to $24_3$ in accordance with the image data. The emitted light is focused on the surface of the photosensitive material 14 by the microlens 16 corresponding thereto to thereby expose portions of the photosensitive material 14 corresponding to the three lines at one time. Each portion to be exposed on each main-scanning line at this time is shown in FIG. 8B.

Figure 4C:
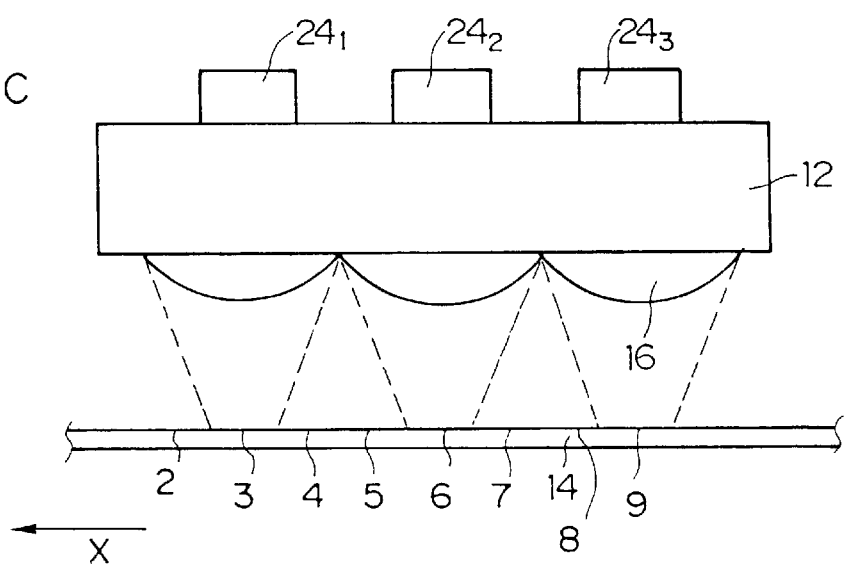
FIG. 4C is a schematic cross-sectional view for explaining the exposure operation of the exposure head according to the first embodiment of the present invention.

As shown in FIG. 4C, while the photosensitive material 14 is conveyed (sub-scanned), once a main-scanning line 3 reaches a position where an organic EL element on the first cathode line $24_1$, a main-scanning line 6 reaches an exposure position of an organic EL element on the second cathode line $24_2$, and a main-scanning line 9 reaches an exposure position of an organic EL element on the third cathode line $24_3$. Image data covering three main-scanning lines is transferred from the driver to each exposure head. Light is emitted from each of the organic EL elements comprising the three cathode lines $24_1$ to $24_3$ in accordance with the image data. The emitted light is focused on the surface of the photosensitive material 14 by the microlens 16 corresponding thereto to thereby expose portions of the photosensitive material 14 corresponding to the three lines at one time. Here, each portion to be exposed on each main-scanning line is shown in FIG. 8C.

Figure 9:
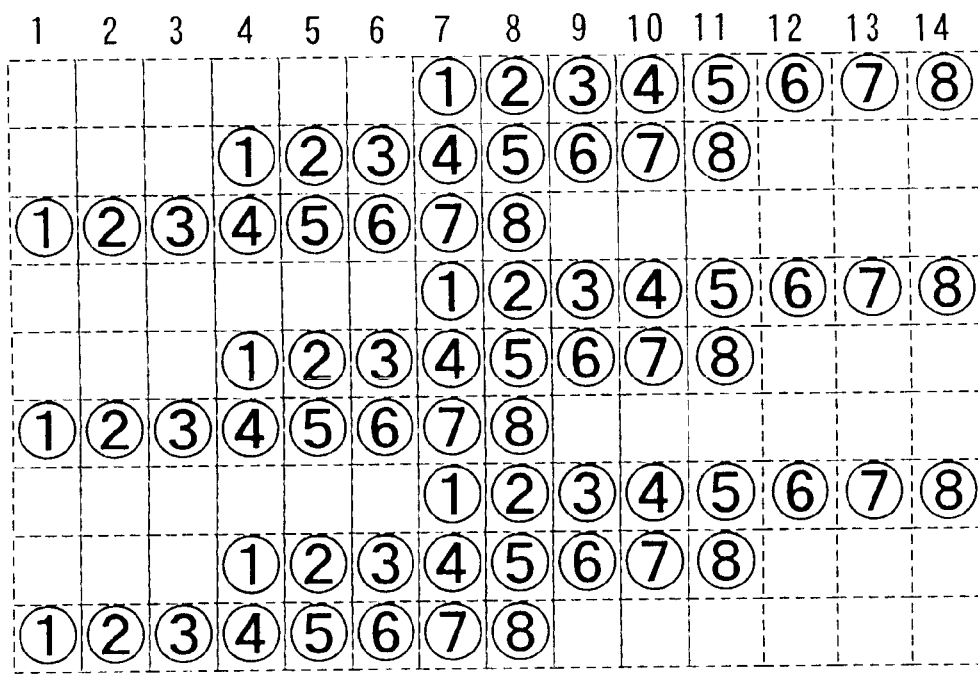
FIG. 9 is a view showing a portion to be exposed of the surface of the photosensitive material.

In the same manner as described above, when a portion of the photosensitive material 14 corresponding to one line is conveyed, portions of the photosensitive material 14 corresponding to the three lines are exposed at one time. Each portion to be exposed on each main-scanning line is shown in FIG. 8D. By doing the above-described exposure operation repeatedly, as shown in FIG. 9, a gap between exposure portions is offset, and a predetermined region of the photosensitive material 14 is exposed to form an image thereon. As described above, image data that exposes one main-scanning line is converted to three, i.e. first to third image data so as to correspond to three cathode lines. For example, due to a first exposure on the basis of the first image data by an organic EL element on the third cathode line $24_3$, a fourth exposure on the basis of the second image data by an organic EL element on the second cathode line $24_2$, and a seventh exposure on the basis of the third image data by an organic EL element on the first cathode line $24_1$, an entire main-scanning line 7 can be exposed. Moreover, in FIGS. 8A to 8D, and FIG. 9, numbers ①,②,③ ... are given to portions to be exposed in a sequential order. Each of the exposure spots having the numbers ①,②,③ ... corresponds to one pixel.

Driving circuits for the drivers, light emitting timing of the organic EL elements, conveying speed of the photosensitive material, and image patterns for image data can be suitably designed in accordance with image.

As described above, since the exposure head of the present embodiment comprises the microlenses by corresponding one microlens to each organic EL element by 1 to 1, converging efficiency of a lens can improve. The organic EL elements on the three, i.e. first to third cathode lines emit light at one time, and one main-scanning line is exposed by organic EL elements on those three cathodes lines, whereby the exposure spots which are exposed by the organic EL elements incorporated in the cathode lines are offset, and the entire photosensitive material is exposed.

Since the area of the microlens aperture is made larger than that of the light emitting portion of the organic EL element, the size of the exposed spot can be decreased, and a sufficient exposure amount can be obtained, and optical crosstalk can be reduced. Further, even when the area of the microlens aperture is made larger, since the main-scanning line is exposed by the organic EL elements which are disposed on the cathode lines and whose pixel locations are slightly shifted from one another, unexposed portions are not formed on the photosensitive material, and an image can be exposed at high resolution.

Since a gap between the exposure spots is offset by the organic EL elements 18 incorporated in n lines (n is an integer of 2 or more) of the cathode line 24, it is possible to compensate the amount of image quality deterioration due to the increase of the area of the microlens aperture thus leading to the increase of the distance between which the organic EL elements are disposed. Main-scanning direction image resolution to be compensated by this is determined by the off-set amount in which the organic EL elements are shifted from one another in the main-scanning direction through n lines of the cathode lines 24, i.e. by an array pitch p of each organic EL element 18 in the main-scanning direction of the entire exposure heads. Sub-scanning direction image resolution can be controlled by an amount in which the photosensitive material 14 is fed (sub-scanning direction control amount).

In the above-description, description has been made of an example of the organic EL element 18 having a square light emitting portion whose ratios (lengths) in the main-scanning direction and the sub-scanning direction are the same. However, a shape of the light emitting portion of the organic EL element 18 is not especially limited, as long as it has a predetermined dimension either in the main-scanning direction or the sub-scanning direction. For example, a shape such as an ellipse or a rectangle having different ratios either in the main-scanning direction or the sub-scanning direction can be used. Moreover, a shape such as a polygon, a shape in which corners of the polygon are cut off, or a circle.

Figure 10A:
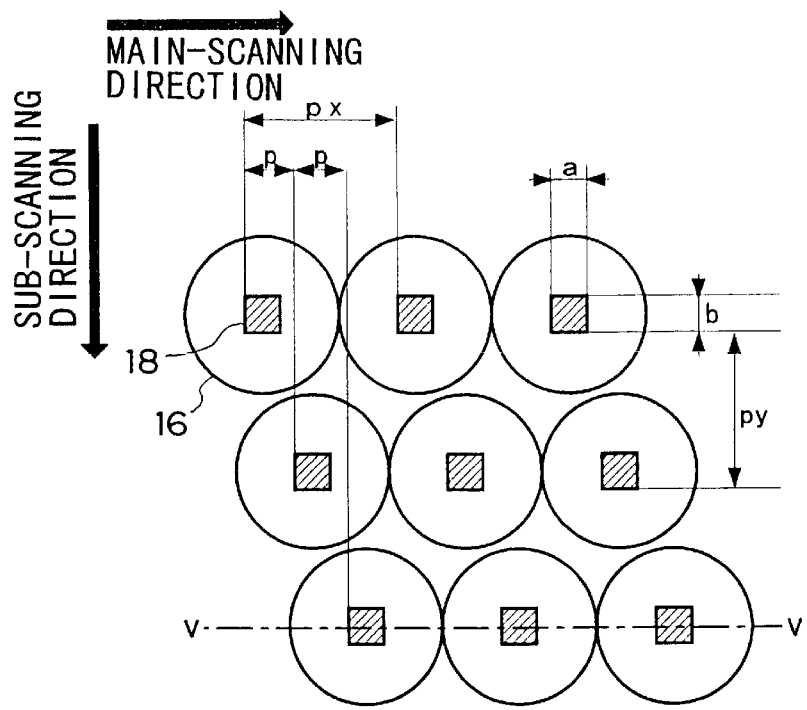
FIG. 10A is a view explaining a relationship between an array of the organic EL elements and image resolution and shows a schematic plan view of a layout of the microlenses and the organic EL elements.
Figure 10B:
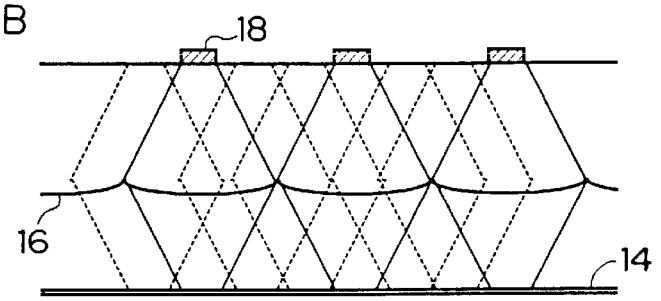
FIG. 10B is a view explaining a relationship between an array of the organic EL elements and image resolution and shows a cross-sectional view taken along a line V—V.

As shown in FIG. 10, the organic EL electrodes in this case can be formed on n lines of the cathode lines 24 so that positions of the organic EL elements 18 are shifted in the main-scanning direction by an array pitch p=px/n, wherein a pitch of each of the organic EL elements arranged in the main-scanning direction on the same cathode line 24 is represented by px (hereinafter, main-scanning element pitch). Accordingly, a main-scanning direction image resolution that corresponds to the array pitch p can be obtained. FIG. 10 shows an example of n=3.

The microlens 16 in this case is formed such that the aperture diameter D of the microlens satisfies a relationship of $D \leq px$, and $D \leq (py^2+p^2)^{1/2}$, wherein py represents one row arranged in the sub-scanning direction, i.e. an array pitch of one organic EL element 18 in the sub-scanning direction (hereinafter, sub-scanning element pitch), when a main-scanning element pitch is px, a sub-scanning element pitch is py, and an array pitch is p, whereby the center of a circular microlens 16 can correspond to that of the corresponding organic EL element 18.

Figure 10C:
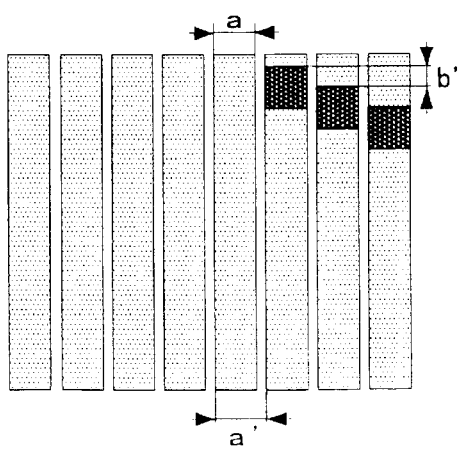
FIG. 10C is a view illustrating image printing results.

As shown in FIG. 10C, in the size of the light emitting portion of the organic EL element (element size), there is no need of necessarily corresponding a main-scanning direction element size a and a sub-scanning direction element size b of each organic EL element to a main-scanning direction pixel pitch a' and a sub-scanning direction pixel pitch b' (sub-scanning control amount) in a printed image corresponding to each image resolution in the main-scanning direction and the sub-scanning direction.

As long as a size of the element size does not affect image quality, the neighboring pixels (exposure spots) can be shifted from each other in the main-scanning direction or in the sub-scanning direction at a predetermined distance, for example, a'>a or b>b'. On the contrary, the neighboring pixels (exposure spots) can overlap with one another in the main-scanning direction or in the sub-scanning direction at a predetermined pitch, for example, a'<a or b<b'. If an exposure spot diameter can be made smaller than a diameter of the light emitting portion of the organic EL element 18 by converging light by using the microlens 16, the size can be a'<a. In such a case, the organic EL electrodes 18 are arranged on n lines of the cathode lines 24 in the sub-scanning direction at an array pitch p<a, thus enabling an image to be recorded at higher resolution.

A monochrome image can be formed by using the exposure head according to the present embodiment of the present invention. Besides, a color image can be formed by providing the exposure head for each of R, G, and B three colors or by equipping the exposure head with a mechanism such as a color film in which the exposure head is divided into R, G, and B three colors.

(Second Embodiment)

Description of an exposure head according to another embodiment of the exposure device of the present invention will be given next. The exposure head of the present embodiment is structured in the same manner as that in the first embodiment of the present invention, except that the organic EL element array comprises organic EL elements for R, G, and B three colors (hereinafter, RGB three colors), and layout of the microlenses, the organic EL elements, and the electrodes is different from that in the first embodiment of the present invention. Therefore, description of only different points will be given.

Figure 5A:
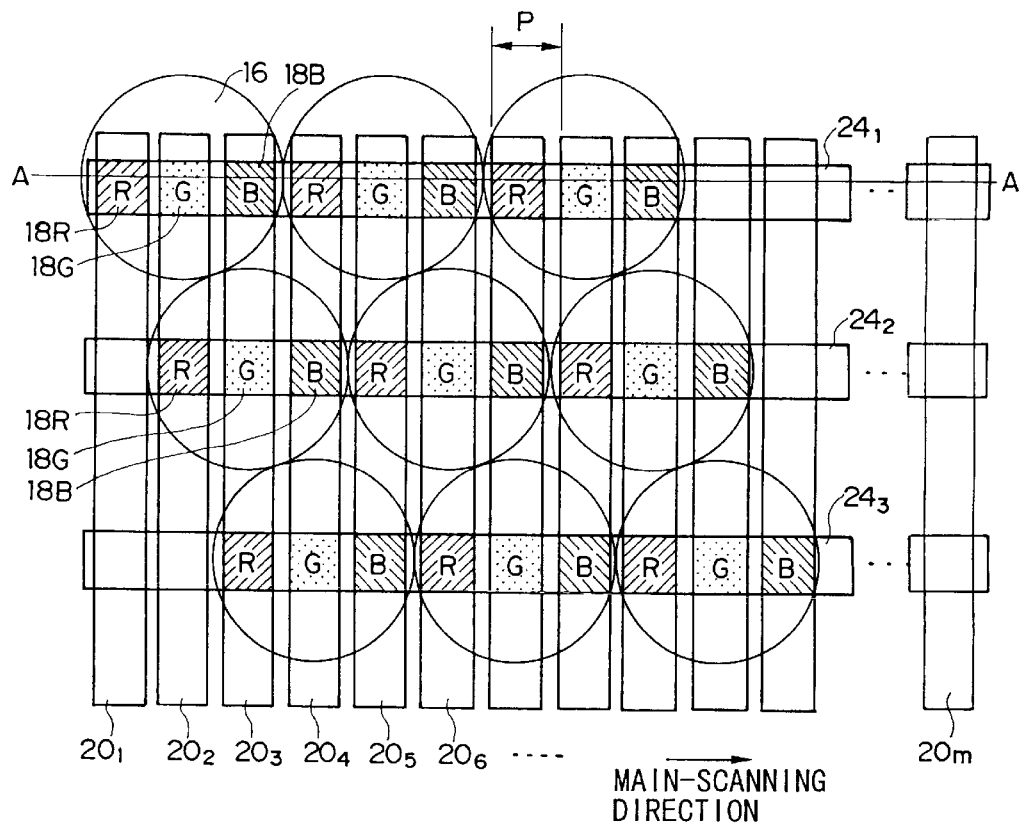
FIG. 5A is a plan view illustrating a layout of microlenses, organic EL elements, and electrodes of an exposure head according to a second embodiment of the present invention.
Figure 5B:
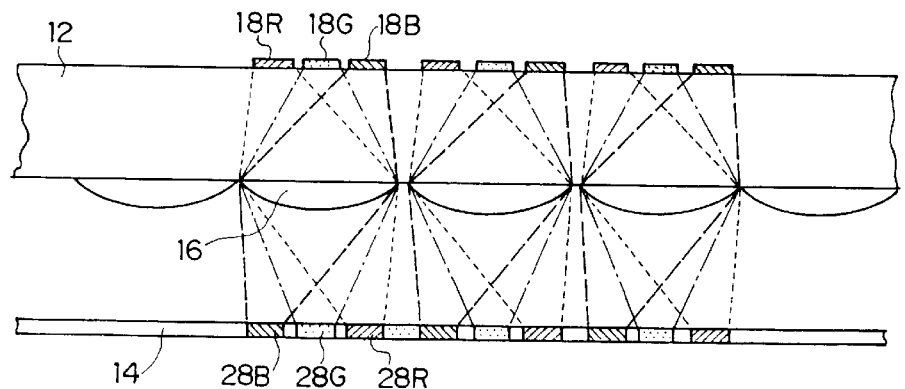
FIG. 5B is a cross-sectional view taken along a line A—A of FIG. 5A.

FIG. 5A is a schematic diagram of a layout of the microlenses 16, the organic EL elements 18, the anode lines 20₁ to 20ₘ, and the cathode lines 24₁ to 24₃ according to a second embodiment of the present invention. The aperture diameter D of one microlenses 16 is about three times a pitch p of one organic EL element 18, i.e. D=3p. Each microlens 16 is formed so as to correspond to each of the sets of RGB three colors comprising an organic EL element 18R, an organic EL element 18G, and an organic EL element 18B by 1 to 1, which are arranged in the main-scanning direction. As shown in FIG. 5B, light emitted from one set of the organic EL elements 18R, 18G, and 18B is focused on the photosensitive material 14 by each microlens 16, whereby exposure spots 28R, 28G and 28B are formed.

In the present embodiment, it is noted that the organic EL elements 18R, 18G, and 18B comprising RGB three colors are arranged in the main-scanning direction in a predetermined order on intersecting portions of m lines of the anodes lines 20₁ to 20ₘ and three lines of the cathode lines 24₁ to 24₃.

For example, R color organic EL elements 18R are disposed on the first cathode line 24₁ at intersecting portions of the anode line 20₁ and the cathode line 24₁, the anode line 20₄ and the cathode line 24₁, and the anode line 20₇ and the cathode line 24₁. G color organic EL elements 18G are disposed on the second cathode line 24₂ at intersecting portions of the anode line 20₂ and the cathode line 24₁, the anode line 20₅ and the cathode line 24₁, and the anode line 20₈ and the cathode line 24₁, and B color organic EL elements 18B are disposed on the third cathode line 24₃ at intersecting portions of the anode line 20₃ and the cathode line 24₁, the anode line 20₆ and the cathode line 24₁, and the anode line 20₉ and the cathode line 24₁. The organic EL elements 18R, 18G, and 18B comprising RGB three colors are sequentially formed on the second negative line 24₂ at positions which are shifted by an array pitch p of each organic EL element in the main-scanning direction from the positions of the organic EL elements 18 on the first cathode line 24₁. Similarly, the organic EL elements 18R, 18G, and 18B comprising RGB three colors are sequentially formed on the third negative line 24₃ at positions which are shifted by an array pitch p of each organic EL element in the main-scanning direction from the positions of the organic EL elements 18 on the second cathode line 24₂.

For example, in a case of specific color organic EL elements, i.e. R color organic EL elements 18R, a predetermined gap is formed between two adjacent organic EL elements in the main-scanning direction. In the same manner as the first embodiment of the present invention, this gap can be offset by the R color organic EL elements formed on the other two cathode lines.

Description of exposure operation of the exposure head according to the present embodiment will be given next. An unillustrated driver is connected to the exposure head to directly modulate each of the organic EL elements 18 in accordance with image data. Further, image data per R, G, and B three colors for exposing one main-scanning line are converted to three, i.e. first to third image data for each color so as to correspond to three cathode lines $24_1$ to $24_3$.

As shown in FIG. 4A, the photosensitive material 14 is conveyed by an unillustrated conveying means at a predetermined speed in the direction of arrow X (inverse direction of the sub-scanning direction). Once a main-scanning start line 1 reaches an exposure position of an organic EL element on the first cathode line $24_1$, a main-scanning line 4 at the same time reaches an exposure position of an organic EL element on the second cathode line $24_2$, and a main-scanning line 7 at the same time reaches an exposure position of an organic EL element on the third cathode line $24_3$. Image data covering three main-scanning lines is transferred from the driver to each exposure head. Light is emitted from each of the organic EL elements 18R, 18G, and 18B on the three cathode lines $24_1$ to $24_3$ in accordance with image data. The emitted light is focused on the surface of the photosensitive material 14 by the microlens 16 corresponding thereto, whereby portions of the photosensitive material 14 corresponding to the three lines are exposed at one time. More specifically, as shown in FIG. 5A, B color exposure spot 28B is formed under the organic EL element 18R, G color exposure spot 28G is formed under the organic EL element 18G, and R color exposure spot 28R is formed under the organic EL element 18B so as to correspond to the organic EL elements 18R, 18B and 18G, respectively.

Since the number of the organic EL elements on one cathode line is three times the number of the exposure heads of the first embodiment, the amount of the emitted light per an element is ⅓. Three times time will be taken to expose the photosensitive material by the same driving power.

As shown in FIG. 4B, while the photosensitive material 14 is conveyed (sub-scanned), once a main-scanning line 2 reaches an exposure position of an organic EL element on the first cathode line $24_1$, a main-scanning line 5 at the same time reaches an exposure position of an organic EL element on the second cathode line $24_2$, and a main-scanning line 8 at the same time reaches an exposure position of an organic EL element on the third cathode line $24_3$. Image data covering three main-scanning lines is transferred from the driver to each exposure head. Light is emitted from each of the organic EL elements 18R, 18G, and 18B on the three cathode lines $24_1$ to $24_3$ in accordance with the image data. The emitted light is focused on the surface of the photosensitive material 14 by each corresponding microlens 16, whereby portions of the photosensitive material 14 corresponding to three lines in RGB three colors are exposed at one time.

As shown in FIG. 4C, while the photosensitive material 14 is conveyed (sub-scanned), once a main-scanning line 3 reaches a position where an organic EL element on the first cathode line $24_1$, a main-scanning line 6 reaches an exposure position of an organic EL element on the second cathode line $24_2$, and a main-scanning line 9 reaches an exposure position of an organic EL element on the third cathode line $24_3$. Image data covering three main-scanning lines is transferred from the driver to each exposure head. Light is emitted from each of the organic EL elements 18R, 18G, and 18B comprising the three cathode lines $24_1$ to $24_3$ in accordance with the image data. The emitted light is focused on the surface of the photosensitive material 14 by the microlens 16 corresponding thereto, whereby portions of the photosensitive material 14 corresponding to the three lines in RGB three colors are exposed at one time.

The second embodiment of the present invention is structured in the same manner as the first embodiment of the present invention except that the organic EL elements comprising RGB three colors which are arranged per one microlens in the main-scanning direction, and each image data covers image data for RGB three colors. By repeating the above-described exposing operation, one main-scanning line is exposed for each color on the basis of each of the three, i.e. first to third image data, whereby a gap between the exposure portions can be offset. The organic EL elements comprising RGB three colors are disposed on one anode line, and the same pixels on the main-scanning line are superimposed in RGB three colors and then exposed. Accordingly, a predetermined region of the photosensitive material 14 is exposed by RGB three colors, and a color image is thereby formed.

As described above, since the exposure head of the present embodiment comprises the microlenses by corresponding one microlens to a set of the organic EL elements comprising RGB three colors by 1 to 1, and exposes the photosensitive material 14 at one time. However, since the organic EL elements corresponding to one microlens have different light emitting wavelengths, from a viewpoint of each color, it is not different from a case in which one microlens is corresponded to one organic EL element by 1 to 1. Accordingly, the exposure head for color exposure can be structured by simple electrode wiring, and light converging efficiency can be improved in the same manner as the first embodiment.

Light can be emitted from the organic EL elements on the three, i.e. first to third cathode lines at one time to thereby expose one main-scanning line by the organic EL elements on those three cathodes lines. Accordingly, the exposure spots which are exposed by the organic EL elements incorporated in each cathode line are offset for each color, whereby the entire photosensitive material is exosed.

Since the area of the microlens aperture is made larger than that of the light emitting portion of the organic EL element, the exposed spot site can be decreased, and a sufficient exposure amount can be obtained, and optical crosstalk can be reduced. Further, even when the area of the microlens aperture is made larger, since the main-scanning line is exposed by the organic EL elements which are disposed on the cathode lines and whose pixel locations are slightly shifted from one another, unexposed portions are not formed on the photosensitive material, and an image can be exposed at high resolution.

Third Embodiment

Description of an exposure head according to yet another embodiment of the exposure device of the present invention will be given next. The exposure head according to a third embodiment of the present invention is structured in the same manner as that in the first embodiment of the present invention, except that the organic EL element array comprises organic EL elements for R, G, and B three colors (hereinafter, RGB three colors), and layout of the microlenses, the organic EL elements, and the electrodes is different from that in the first embodiment of the present invention. Therefore, description of different points only will be given.

FIG. 6 is a schematic diagram of a layout of the microlenses 16, the organic EL elements 18, the anode lines $20_1$ to $20_m$, and the cathode lines $24_1$ to $24_9$ according to a third embodiment of the present invention. The aperture diameter D of one microlenses 16 is about three times a pitch p of one organic EL element 18, i.e. D=3p. Each microlens 16 is formed so as to correspond to each of the sets of RGB three colors comprising an organic EL element 18R, an organic EL element 18G, and an organic EL element 18B by 1 to 1, which are arranged in the main-scanning direction. Each microlens 16 focuses light which is emitted from one set of the organic EL elements 18R, 18G, and 18B on the photosensitive material 14 by each microlens 16, and thereby forms exposure spots.

In the present embodiment, the organic EL elements 18 of the same color are arranged in the main-scanning direction every third, and the organic EL elements 18R, 18G, and 18B for RGB three colors are arranged in the sub-scanning direction at intersecting portions of m lines of the anodes lines $20_1$ to $20_m$ and nine cathode lines $24_1$ to $24_9$.

With respect to a first cathode line $24_1$, the R color organic EL elements 18R are disposed on the first cathode line $24_1$ at intersecting portions of the anode line $20_1$ and the cathode line $24_1$, the anode line $20_4$ and the cathode line $24_1$, and the anode line $20_7$ and the cathode line $24_1$. With respect to a second cathode line $24_2$, the G color organic EL elements 18G are disposed on the second cathode line $24_2$ at intersecting portions of the anode line $20_1$ and the cathode line $24_2$, the anode line $20_4$ and the cathode line $24_2$, and the anode line $20_7$ and the cathode line $24_2$. With respect to a third cathode line $24_2$, the B color organic EL elements 18B are disposed on the third cathode line $24_3$ at intersecting portions of the anode line $20_1$ and the cathode line $24_3$, the anode line $20_4$ and the cathode line $24_3$, and the anode line $20_7$ and the cathode line $24_3$.

The R color organic EL elements are formed on the fourth cathode line $24_4$ at positions which are shifted in the main-scanning direction by the array pitch p of one organic EL element respectively from the positions of the organic EL elements 18R on the first cathode line $24_1$. Similarly, the G color organic EL elements 18G are formed on the fifth cathode line $24_5$ at positions which are shifted in the main-scanning direction, by the array pitch p of each organic EL element, respectively from the positions of the organic EL elements 18G on the second cathode line $24_2$. The B color organic EL elements 18B are formed on the sixth cathode line $24_6$ at positions which are shifted in the main-scanning direction, by the array pitch p of each organic EL element, respectively from the positions of the organic EL elements 18B on the third cathode line $24_3$.

The R color organic EL elements 18R are formed on the seventh cathode line $24_7$ at positions which are shifted in the main-scanning direction, by the array pitch p of each organic EL element, respectively from the positions of the organic EL elements 18R on the fourth cathode line $24_4$. Similarly, the G color organic EL elements 18G are formed on the eighth cathode line $24_8$ at positions which are shifted in the main-scanning direction, by the array pitch p of each organic EL element, respectively from the positions of the organic EL elements 18G on the fifth cathode line $24_5$. The B color organic EL elements 18B are formed on the ninth cathode line $24_9$ at positions which are shifted in the main-scanning direction, by the array pitch p of each organic EL element, respectively from the positions of the organic EL elements 18B on the sixth cathode line $24_6$.

In the case of specified color organic EL elements, for example, the R color organic EL elements 18R, a predetermined gap is formed between two adjacent organic EL elements 18R in the main-scanning direction on the first cathode line $24_1$. Such a predetermined distance is offset by the R color organic EL element 18R formed on the fourth cathode line $24_4$ and the one on the seventh cathode line $24_7$.

Description of an exposure operation of the exposure head of the present embodiment will be given next. An unillustrated driver is connected to the exposure head to directly modulate each of the organic EL elements 18 in accordance with image data. Further, image data per RGB three colors for exposing one main-scanning line are corresponded to three cathode lines having respective color organic EL elements and converted to three, i.e. first to third image data.

Figure 7A:
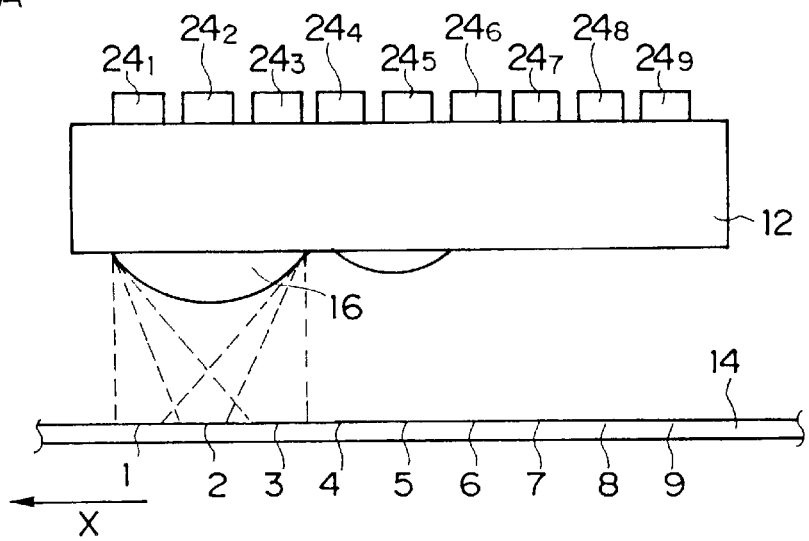
FIG. 7A illustrates exposure operation of the exposure head according to the third embodiment of the present invention, and is a cross-sectional view taken along a line B—B of the exposure head of FIG. 6.
Figure 7B:
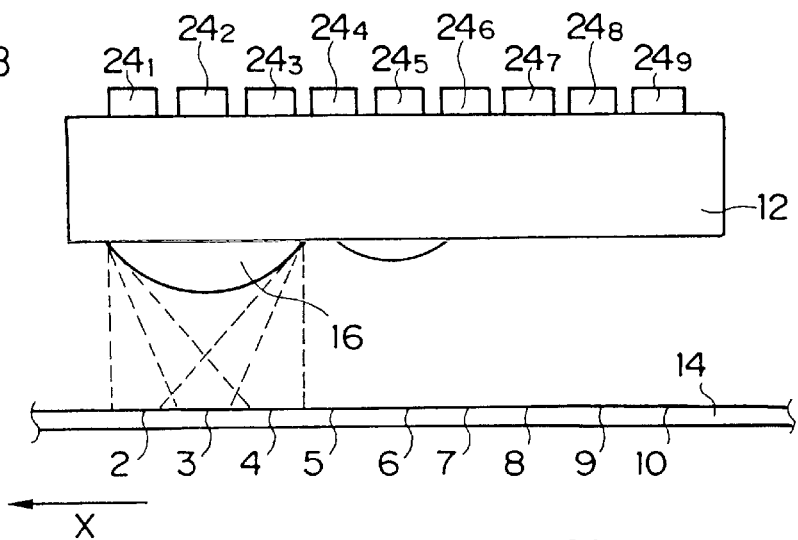
FIG. 7B illustrates exposure operation of the exposure head according to the third embodiment of the present invention, and is a cross-sectional view taken along a line B—B of the exposure head of FIG. 6.
Figure 7C:
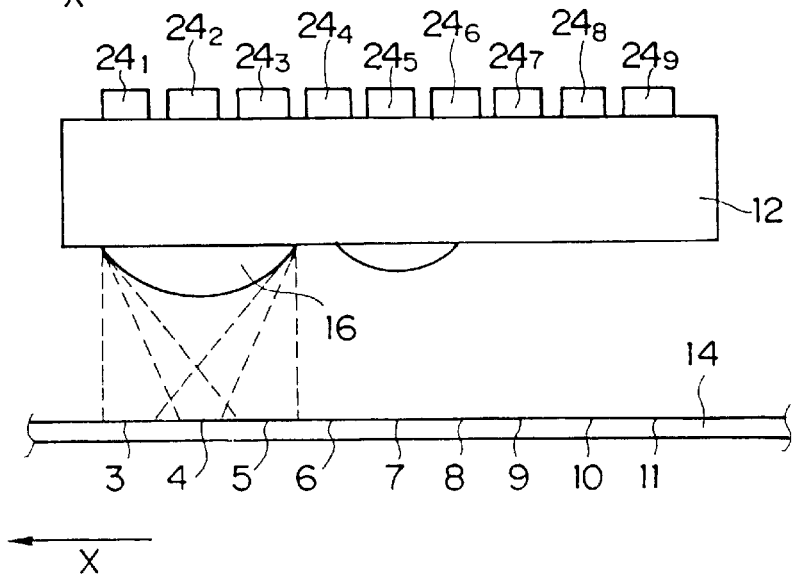
FIG. 7C illustrates exposure operation of the exposure head according to the third embodiment of the present invention, and is a cross-sectional view taken along a line B—B of the exposure head of FIG. 6.

FIGS. 7A to 7C are cross-sectional views along the cathode line $20_1$ and illustrate a state in which the photosensitive material 14 is exposed while being sequentially conveyed by a conveying means. As shown in FIG. 7A, the photosensitive material 14 is conveyed by the unillustrated conveying means in the direction of arrow X (inverse direction of the sub-scanning direction) at a predetermined speed. When a main-scanning start line 1 reaches an exposure position of the organic EL element on the third cathode line $24_3$, a main-scanning line 2 at the same time reaches an exposure position of the organic EL element on the second cathode line $24_2$, and a main-scanning line 3 reaches an exposure position of the organic EL element on the first cathode line $24_1$. In the same manner as this, when a main-scanning start line 4 reaches an exposure position of the organic EL element on the sixth cathode line $24_6$, a main-scanning line 5 at the same time reaches an exposure position of the organic EL element on the fifth cathode line $24_5$, and a main-scanning line 6 reaches an exposure position of the organic EL element on the fourth cathode line $24_4$. Further, when a main-scanning start line 7 reaches an exposure position of the organic EL element on the ninth cathode line $24_9$, a main-scanning line 8 at the same time reaches an exposure position of the organic EL element on the eighth cathode line $24_8$, and a main-scanning line 9 reaches an exposure position of the organic EL element on the seventh cathode line $24_7$.

Image data in R color per three main-scanning lines is transferred from the driver to each of the exposure heads. In accordance with the R color image data, light are emitted from the organic EL elements 18R of the first cathode line $24_1$, the fourth cathode line $24_4$, and the seventh cathode line $24_7$, and image is focused on the surface of the photosensitive material 14 by the corresponding microlens 16, whereby the photosensitive material 14 per three lines in R color is exposed at one time.

The first image data per three main-scanning lines in G color is transferred from the driver to each of the exposure heads. In accordance with the G color image data, light are emitted from the organic EL elements 18G of the second cathode line $24_2$, the fifth cathode line $24_5$, and the eighth cathode line $24_8$, to expose the photosensitive material 14 for three lines at one time. Subsequently, the first image data per three main-scanning lines in B color is transferred from the driver to each of the exposure heads. In accordance with the B color image data, light are emitted from the organic EL elements 18B of the third cathode line $24_3$, the sixth cathode line $24_6$, and the ninth cathode line $24_9$ to expose the photosensitive material 14 per three lines in B color at one time. In this end, the photosensitive material 14 is exposed in RGB three colors in accordance with image data As shown in FIG. 7B, during the conveyance (sub-scanning) of the photosensitive material 14, when each of the main-scanning lines 2 to 4 reaches the exposure positions of the organic EL elements on the first to third cathode lines $24_1$ to $24_3$, the main-scanning lines 5 to 7 at the same time reach the exposure positions of the organic EL elements on the fourth to sixth cathode lines $24_4$ to $24_6$, and the main-scanning lines 8 to 10 at the same time reach the exposure positions of the organic EL elements on the seventh to ninth cathode lines $24_7$ to $24_9$.

Here, R color image data per three main-scanning lines is transferred from the driver to each exposure head. In accordance with the R color image data, the photosensitive material 14 is exposed in R color per three lines at one time. In a similar manner to this, In accordance with G color image data, the photosensitive material 14 is exposed in G color per three lines at one time. Subsequently, in accordance with B color image data, the photosensitive material 14 is exposed in B color per three lines at one time.

As shown in FIG. 7C, during the conveyance (sub-scanning) of the photosensitive material 14, when each of the main-scanning lines 3 to 5 reaches the exposure positions of the organic EL elements on the first to third cathode lines $24_1$ to $24_3$, the main-scanning lines 6 to 8 at the same time reach the exposure positions of the organic EL elements on the fourth to sixth cathode lines $24_4$ to $24_6$, and the main-scanning lines 9 to 11 at the same time reach the exposure positions of the organic EL elements on the seventh to ninth cathode lines $24_7$ to $24_9$.

In a similar manner to the above-description, R color image data per three main-scanning lines is transferred from the driver to each exposure head. In accordance with the R color image data, the photosensitive material 14 per three lines in R color is exposed at one time. Similarly, in accordance with G color image data, the photosensitive material 14 per three lines in G color is exposed at one time. Subsequently, in accordance with B color image data, the photosensitive material 14 per three lines in B color is exposed at one time.

The second embodiment of the present invention is structured in the similar manner to the first embodiment of the present invention except that each of the organic EL elements of RGB three colors which are arranged in the sub-scanning direction is corresponded to one microlens, and each image data is used as each of RGB three image data and is exposed for respective RGB colors by time sharing system. By repeating the above-described exposing operation, one main-scanning line is exposed for each color on the basis of three image data, and a gap between the exposed portions is offset. Further, the organic EL elements of RGB three colors are disposed on one anode line so that the same pixels on the main-scanning line are exposed to overlap in RGB three colors. Consequently, a predetermined region of the photosensitive material 14 is exposed in RGB three colors so that a color image is formed.

As described above, in the exposure head of the present invention, each microlens is corresponded to a set of the RGB three color organic EL elements. Since light is emitted sequentially from each color organic EL element, it is substantially the same as the case in which each microlens is corresponded to a single organic EL element, namely, 1 to 1. In the same manner as in the exposure device in the first embodiment of the present invention, light converging efficiency can be improved.

By emitting light at one time from organic EL elements on three cathode lines having organic EL elements of the same color formed thereon, the three cathode lines can be exposed at one time. One main-scanning line is exposed by organic EL elements on three cathode lines, and exposure spots of the organic EL elements included in each cathode line are offset to one another, whereby the photosensitive material can be exposed without forming unexposed portions. Further, since R, G, and B color organic EL electrodes are respectively formed on different cathode lines, the number of the organic EL electrodes on one cathode line is the same as that of the exposure heads in the first embodiment of the present invention. Accordingly, each of the elements can be driven with the same driving power and for the same exposure time.

Since the area of the microlens aperture is made larger than that of the light emitting portion of the organic EL element, the size of the exposure spot can be decreased so that a sufficient light exposure amount can be obtained and optical crosstalk can be inhibited. Moreover, if the area of the microlens aperture is increased, pixel positions are slightly shifted from one another, and a main-scanning line is exposed by the organic EL element which is disposed on the plurality of the cathode lines, whereby unexposed portions are not formed and image can be exposed at high resolution.

In the above-described first through third embodiments of the present invention, examples in which a convex microlens is provided on the surface of a substrate has been explained. However, a distribution refracting lens or a distribution refracting rod lens to which converging characteristics are applied by forming reflectance distribution inside the substrate by ion injection can be used as a microlens. Further, a combination lens of the convex lens formed at the light emitting side of the transparent substrate and the distribution refracting lens formed in the transparent substrate can be used as a microlens, whereby the microlens aperture diameter becomes larger.

In the first through third embodiments of the present invention, an example in which the aperture of the microlens 16 is formed in a circular shape has been explained. However, the present invention is not limited to this, as long as the area of the aperture is larger than that of the light emitting portion of the organic EL element 18 and neighboring microlenses do not overlap.

Figure 11:
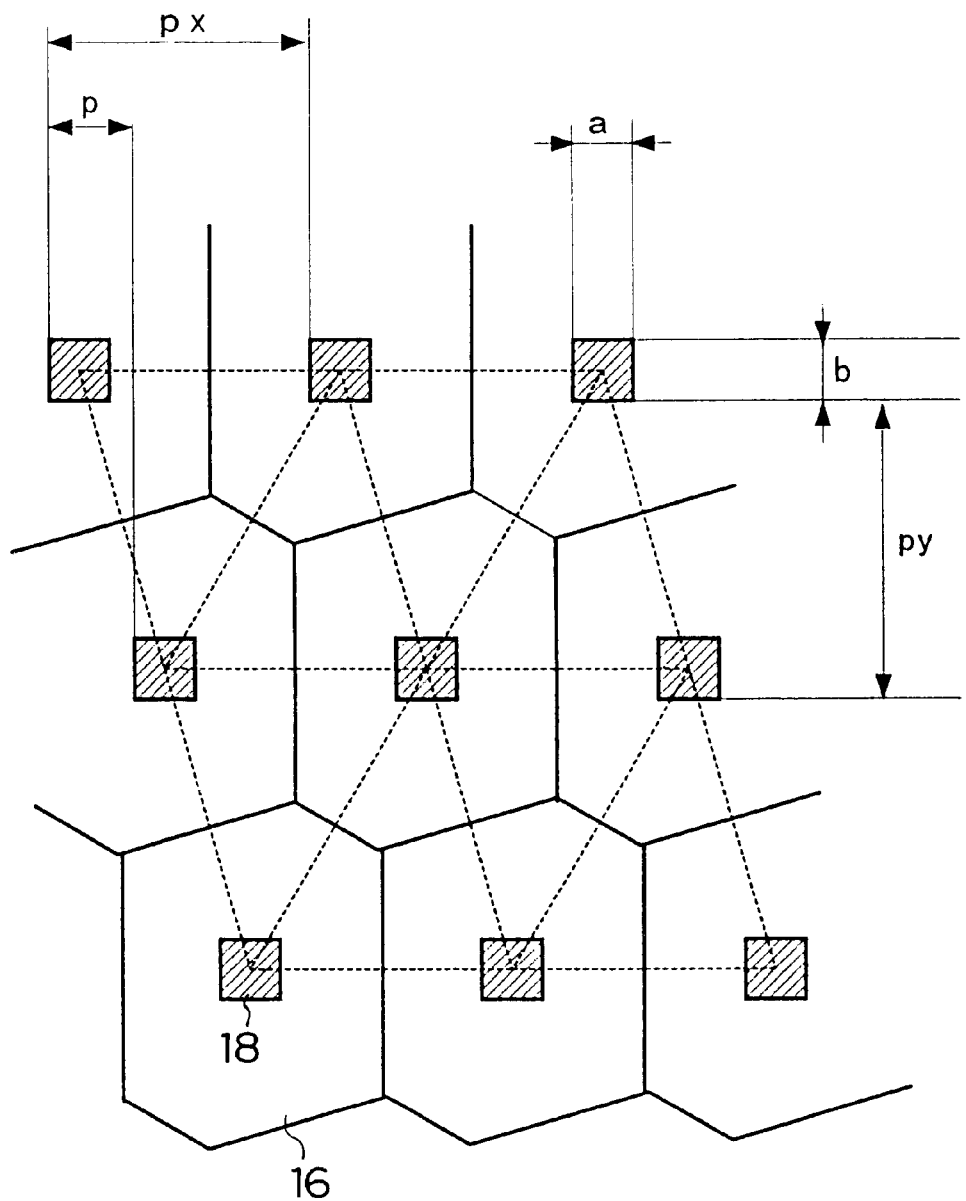
FIG. 11 is a plan view illustrating a layout of the microlenses and the organic EL elements in which configurations of the microlenses and others are shown.

For example, as shown in FIG. 11, in each organic EL element 18, a region enclosed by a perpendicular bisector of a line connecting the light emitting element 18 and the light emitting element 18 adjacent thereto can be a maximal region occupied by the microlens corresponding to the organic EL element. Accordingly, preferably, the microlens 16 is made no larger than the maximum region. FIG. 11 shown a case of the line division number n=3.

However, in order to improve light availability and form an image of higher image quality, it is preferable to make a gap between the neighboring microlenses 16 smaller. In order to maximize the light availability and minimize affection to image quality due to stray light, it is preferable to keep two neighboring microlenses 16 in close contact with each other as close as possible. In this case, it is more effective to partially overlap the two neighboring microlenses 16 each other. Therefore, for example, as shown in FIG. 11, when each side or each boundary of the aperture of the microlens 16 corresponding to each organic EL element is formed so as to correspond to a vertical bisector of a line connecting the neighboring organic EL elements 18, the apertures of the neighboring microlenses can be kept in close contact with one another to thereby form a linear connecting portion. Further, since the configuration of the microlens is not specified, needless to say, the connecting portion can be curved.

In the above-described first through third embodiments of the present invention, although an example in which organic EL elements are used as the electric field light emitting elements has been described, inorganic EL elements can be used. However, the organic EL elements have an advantage of being driven at lower voltage as compared to the inorganic EL elements.

In the above-described first through third embodiments of the present invention, an example in which the photosensitive material is conveyed by a conveying means has been explained. However, a system in which the exposure head moves while the photosensitive material is fixed, or a system in which both the exposure head and the photosensitive material move can be adopted.

In the above-described first through third embodiments of the present invention, an example in which each organic EL element of the exposure head is modulated directly by the driver has been described. However, the organic EL element is used as back light, and is modulated externally and exposed by using shutter arrays such as filters and liquid crystal shutter array, and PLZT (composed oxides such as zinc, lantern, zirconium, and titanium) optical shutter array to form an image.

As described above, description of the embodiments of the present invention has been given. However, as many apparently widely different embodiments of this invention may be made without departing from the spirit and scope thereof, it is to be understood that the invention is not limited to the specific embodiments thereof except as defined in the appended claims. Namely, (1) The first exposure device is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, and the electric field light emitting elements each including a light emitting portion; and microlenses, each one of which is formed on the transparent substrate so as to correspond to one of the electric field light emitting elements and focuses light emitted from the light emitting portion of the one electric field light emitting element for exposing an object to be exposed, wherein the one microlens has an aperture which is larger than an array pitch of the one corresponding electric field light emitting element, and the electric field light emitting elements are arranged such that a portion corresponding to a gap between portions exposed by the light emitting portions of one of the rows can be exposed by one of the light emitting portions of an adjacent one of the rows.

(2) In this exposure device, each of the light emitting portions of the electric field light emitting elements is formed so as to have a predetermined dimension either in the main-scanning direction or the sub-scanning direction, n rows (n is an integer of 2 or more) are arranged in the sub-scanning direction, and the electric field light emitting elements are arranged so that an array pitch p of each of the light emitting portions in one of the neighboring rows and the other can satisfy a relationship of p=px/n, wherein px represents an array pitch of the electric field light emitting elements in each row. Namely, since image resolution in the main-scanning direction can be controlled by the array pitch of the electric field light emitting element in the main-scanning direction, while image resolution in the sub-scanning direction can be controlled by an amount in which the exposure device and the object to be exposed relatively move in the sub-scanning direction (sub-scanning control amount), the configuration of the light emitting portion of the electric field light emitting element is not specially limited.

(3) In this case, it is preferable that the microlens aperture diameter D satisfies a relationship of $D \leq px$, and $D \leq (py^2+p^2)^{1/2}$, wherein py represents an array pitch of the row of the elements in the sub-scanning direction. Accordingly, when a circular microlens is used, the center of one light emitting element is corresponded to that of the corresponding microlens, whereby the microlenses can be disposed so as to correspond to each of the electric field light emitting elements without overlapping one another.

(4) In the exposure device, as described in the first embodiment of the present invention, the microlens aperture diameter D is n times (n is an integer of 2 or more) of the array pitch p of an electric field light emitting element corresponding to the microlens, n rows are disposed in the sub-scanning direction, and the electric field light emitting elements are arranged so that the light emitting portions in one of the neighboring rows and the light emitting portions in the other are shifted from each other in the main-scanning direction by the array pitch p.

(5) The second exposure device is an exposure device comprising: a transparent substrate; rows which are formed on the transparent substrate, the rows including electric field light emitting elements arranged in a main-scanning direction and separated from one another at a predetermined spacing, the rows being arranged in a sub-scanning direction, the electric field light emitting elements each including a light emitting portion, and the electric field light emitting elements being arranged so as to form a plurality of sets, each set including electric field light emitting elements that have mutually different light emitting wavelengths arranged in one of the main-scanning direction and the sub-scanning direction; and microlenses each one of which is formed on the transparent substrate so as to correspond to one of the sets of electric field light emitting elements, and focuses light emitted from the light emitting portions of the one set for exposing an object to be exposed, wherein the one microlens has an aperture which is larger than an array pitch of each of the electric field light emitting elements forming the one set of electric field light emitting elements, and the electric field light emitting elements are arranged so that a portion corresponding to a gap between portions exposed by light emitting portions of one light emitting wavelength in one of the rows can be exposed by one of light emitting portions, of the one light emitting wavelength in an adjacent one of the rows.

(6) In the above-described first and second exposure devices, the microlens can use a convex lens formed at a light emitting side of the transparent substrate, a distribution refracting lens formed inside the transparent substrate, or a combination lens of the convex lens formed at the light emitting side of the transparent substrate and the distribution refracting lens formed inside the transparent substrate.

(7) In the above-described first and second exposure devices, it is preferable that the electric field light emitting element used an organic electric field light emitting element.

(8) In the above-described first and second exposure devices, it is preferable that the neighboring microlenses are formed by being kept in close contact with one another in order to improve light availability and prevent deterioration of image quality due to stray light.

(9) It is more preferable that the aperture of one of the neighboring microlenses and the aperture of the other are partially overlapped with one another, and the neighboring microlenses are kept in close contact with one another by using a portions of each aperture as a connecting portion. In this case, almost the entire amount of light emitted by the electric field light emitting element can be utilized for the exposure, and substantially maximum availability of the emitted light can be obtained.

The exposure device of the present invention can provide excellent effects in that high availability of the emitted light can be obtained, optical crosstalk is reduced, and an image can be exposed at high resolution.

What is claimed is:

1. An exposure device comprising:
   a transparent substrate;
   rows which are formed on the transparent substrate, the rows including electric field light emitting elements arranged in a main-scanning direction and separated from one another at a predetermined spacing, the rows being arranged in a sub-scanning direction, and the electric field light emitting elements each including a light emitting portion; and
   microlenses, each one of which is formed on the transparent substrate so as to correspond to one of the electric field light emitting elements and focuses light emitted from the light emitting portion of the one electric field light emitting element for exposing an object to be exposed, wherein
      the one microlens has an aperture which is larger than an array pitch of the one corresponding electric field light emitting element, and
      the electric field light emitting elements are arranged such that a portion corresponding to a gap between portions exposed by the light emitting portions of one of the rows can be exposed by one of the light emitting portions of an adjacent one of the rows.

2. The device of claim 1, wherein each of the light emitting portions of the electric light field emitting elements is formed so as to have a predetermined dimension in at least one of the main-scanning direction and the sub-scanning direction, a number of the rows arranged in the sub-scanning direction is n, where n is an integer of at least 2, an array pitch between the electric field light emitting elements within each row is px, and the electric field light emitting elements are arranged such that an array pitch in the main-scanning direction of the light emitting portions of the one row relative to the light emitting portions of the adjacent row is p, wherein p satisfies the relationship p=px/n.

3. The device of claim 2, wherein an aperture diameter D of the one microlens satisfies relationships $D \leq px$, and $D \leq (py^2+p^2)^{1/2}$, wherein py represents an array pitch in the sub-scanning direction of the row of elements.

4. The device of claim 1, wherein a number of the rows arranged in the sub-scanning direction is n, where n is an integer of at least 2, the electric field light emitting elements are arranged such that the light emitting portions of the one row are displaced in the main-scanning direction relative to the light emitting portions of the adjacent row by an array pitch p, and an aperture diameter D of the one microlens is substantially n times the array pitch p.

5. The device of claim 2, wherein a number of the rows arranged in the sub-scanning direction is n, where n is an integer of at least 2, the electric field light emitting elements are arranged such that the light emitting portions of the one row are displaced in the main-scanning direction relative to the light emitting portions of the adjacent row by an array pitch p, and an aperture diameter D of the one microlens is substantially n times the array pitch p.

6. The device of claim 1, wherein the microlens is a convex lens formed at a light emitting side of the transparent substrate.

7. The device of claim 1, wherein the microlens is a distribution refracting lens formed inside the transparent substrate.

8. The device of claim 1, wherein the microlens is a combination lens of a convex lens formed at a light emitting side of the transparent substrate and a distribution refracting lens formed inside the transparent substrate.

9. The device of claim 1, wherein the electric field light emitting element is an organic electric field light emitting element.

10. The device of claim 1, wherein the neighboring microlenses are formed in close contact with one another.

11. The device of claim 10, wherein the respective apertures of the neighboring microlenses partially overlap.

12. An exposure device comprising:
    a transparent substrate;
    rows which are formed on the transparent substrate, the rows including electric field light emitting elements arranged in a main-scanning direction and separated from one another at a predetermined spacing, the rows being arranged in a sub-scanning direction, the electric field light emitting elements each including a light emitting portion, and the electric field light emitting elements being arranged so as to form a plurality of sets, each set including electric field light emitting elements that have mutually different light emitting wavelengths arranged in one of the main-scanning direction and the sub-scanning direction; and
    microlenses each one of which is formed on the transparent substrate so as to correspond to one of the sets of electric field light emitting elements, and focuses light emitted from the light emitting portions of the one set for exposing an object to be exposed, wherein
       the each one of the microlenses has an aperture which is larger than an array pitch of each of the electric field light emitting elements forming the one set of electric field light emitting elements, and
       the electric field light emitting elements are arranged so that a portion corresponding to a gap between portions exposed by light emitting portions of one light emitting wavelength in one of the rows can be exposed by one of light emitting portions, of the one light emitting wavelength in an adjacent one of the rows.

13. The device of claim 12, wherein the microlens is a convex lens formed at a light emitting side of the transparent substrate.

14. The device of claim 12, wherein the microlens is a distribution refracting lens formed inside the transparent substrate.

15. The device of claim 12, wherein the microlens is a combination lens of a convex lens formed at a light emitting side of the transparent substrate and a distribution refracting lens formed inside the transparent substrate.

16. The device of claim 12, wherein the electric field light emitting element is an organic electric field light emitting element.

17. The device of claim 12, wherein the neighboring microlenses are formed in close contact with one another.

18. The device of claim 17, wherein the respective apertures of the neighboring microlenses partially overlap.

* * * * *